United States Patent
Geurts

(10) Patent No.: US 10,298,871 B2
(45) Date of Patent: May 21, 2019

(54) IMAGING SYSTEMS WITH ANALOG-TO-DIGITAL CONVERTERS

(71) Applicant: SEMICONDUCTOR COMPONENTS INDUSTRIES, LLC, Phoenix, AZ (US)

(72) Inventor: Tomas Geurts, Haasrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/670,474

(22) Filed: Aug. 7, 2017

(65) Prior Publication Data

US 2019/0045150 A1 Feb. 7, 2019

(51) Int. Cl.
*H04N 5/378* (2011.01)
*H03M 1/12* (2006.01)

(52) U.S. Cl.
CPC ............ *H04N 5/378* (2013.01); *H03M 1/123* (2013.01)

(58) Field of Classification Search
CPC .............................. H04N 5/378; H03M 1/123
USPC ........................................................ 348/302
See application file for complete search history.

(56) References Cited

U.S. PATENT DOCUMENTS

2012/0249851 A1* 10/2012 Martinussen ........ H04N 5/3598
348/308
2015/0120026 A1* 4/2015 Zhang ................... H03M 1/186
700/94

OTHER PUBLICATIONS

Craninckx et al., "A 65J/Conversion-Step 0-to-50MS/s 0-to-0.7mW 9b Charge-Sharing SAR ADC in 90nm Digital CMOS"; IEEE ISSCC 2007, San Francisco, California, USA; Feb. 11-15, 2007.
Kull et al. "A 10b 1.5GS/s Pipelined-SAR ADC with Background Second-Stage Common-Mode Regulation and Offset Calibration in 14nm CMOS FinFET"; IEEE ISSCC 2017, San Francisco, California, USA; Feb. 5-9, 2017.

* cited by examiner

*Primary Examiner* — Lin Ye
*Assistant Examiner* — Chant T Nguyen
(74) *Attorney, Agent, or Firm* — Treyz Law Group, P.C.; Joseph F. Guihan

(57) ABSTRACT

An image sensor may contain an array of imaging pixels arranged in rows and columns. Each column of imaging pixels may be coupled to a column line which is used to read out imaging signals from the pixels. The column line may be coupled to an analog-to-digital converter for converting analog imaging signals from the pixels to digital signals. An amplifier may be included to amplify the analog imaging signals before being converted by the analog-to-digital converter. However, amplifier gain uncertainties may lead to errors in the result of the analog-to-digital conversion when the analog imaging signals are amplified by an amplifier. To mitigate these types of errors, the reference voltage for a digital-to-analog converter in the analog-to-digital converter may also be amplified by the amplifier. By multiplying the reference voltage by the same amplifier gain as the imaging signals, uncertainties in the amplifier gain will not affect the results of the analog-to-digital conversion.

18 Claims, 5 Drawing Sheets

US 10,298,871 B2

IMAGING SYSTEMS WITH ANALOG-TO-DIGITAL CONVERTERS

BACKGROUND

This relates generally to analog-to-digital converters, and more specifically, to massively parallel analog-to-digital converters. Massively parallel analog-to-digital converters may be included within image sensors.

Modern electronic devices such as cellular telephones, cameras, and computers often use digital image sensors. Image sensors (sometimes referred to as imagers) may be formed from a two-dimensional array of image sensing pixels. The array of image sensing pixels are typically arranged in pixel rows and columns. Each pixel includes a photosensitive layer that receives incident photons (light) and converts the photons into electrical charge. Column sensing circuitry is typically coupled to each pixel column for reading out image signals from the image pixels.

Conventional image sensors often include analog-to-digital conversion circuitry to convert analog signals from the image pixels to digital signals. Amplifiers may be included to amplify the analog signals from the image pixels prior to analog-to-digital conversion. Amplifiers have an associated gain that determines the amount by which the analog signals are multiplied. However, conventional image sensors can have uncertain or inconsistent amplifier gains that can lead to inaccuracies in the analog-to-digital conversion.

It would therefore be desirable to be able to provide improved analog-to-digital converters for converting signals amplified by an amplifier.

DETAILED DESCRIPTION

Embodiments of the present invention relate to image sensors, and more particularly to analog-to-digital conversion within image sensors. It will be recognized by one skilled in the art, that the present exemplary embodiments may be practiced without some or all of these specific details. In other instances, well-known operations have not been described in detail in order not to unnecessarily obscure the present embodiments.

Figure 1:
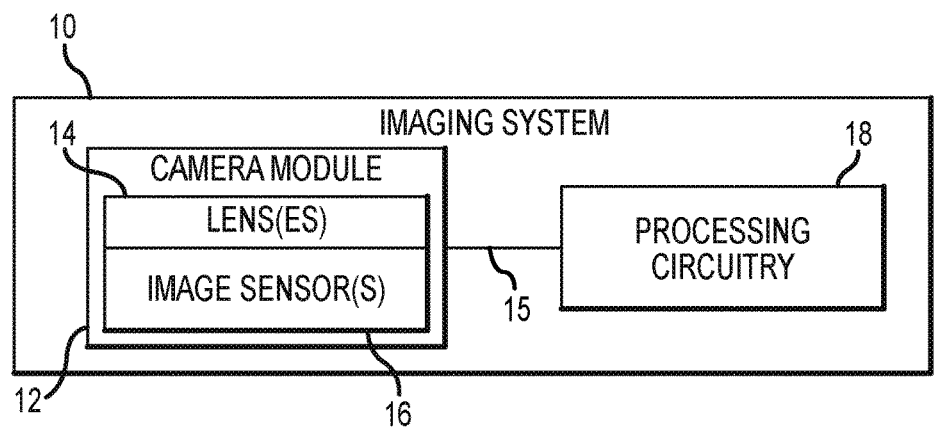
FIG. 1 is a diagram of an illustrative electronic device in accordance with an embodiment of the present invention.

FIG. 1 is a diagram of an illustrative electronic device in accordance with an embodiment of the present invention. As shown in FIG. 1, imaging system 10 may be a portable imaging system such as a camera, automotive imaging system, cellular telephone, video camera, video surveillance system, or any other desired imaging device that captures digital image data. System 10 may include a camera module 12 that is used to convert incoming light into digital image data. Camera module 12 may include an array of lenses 14 and corresponding image sensor(s) 16. Lens(es) 14 and image sensor(s) 16 may be mounted in a common package and may provide image data to processing circuitry 18. Image sensors 16 may include one or more image sensors and lens array 14 may include one or more corresponding lenses.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor array 16 or an integrated circuit within module 12 that is associated with image sensor array 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Each pixel in image sensor(s) 16 may receive light of a given color by providing each image pixel with a color filter. The color filters that are used for image sensor pixels in the image sensors may, for example, be red filters, blue filters, and green filters. Other filters such as white color filters, dual-band IR cutoff filters (e.g., filters that allow visible light and a range of infrared light emitted by LED lights), etc. may also be used.

Figure 2:
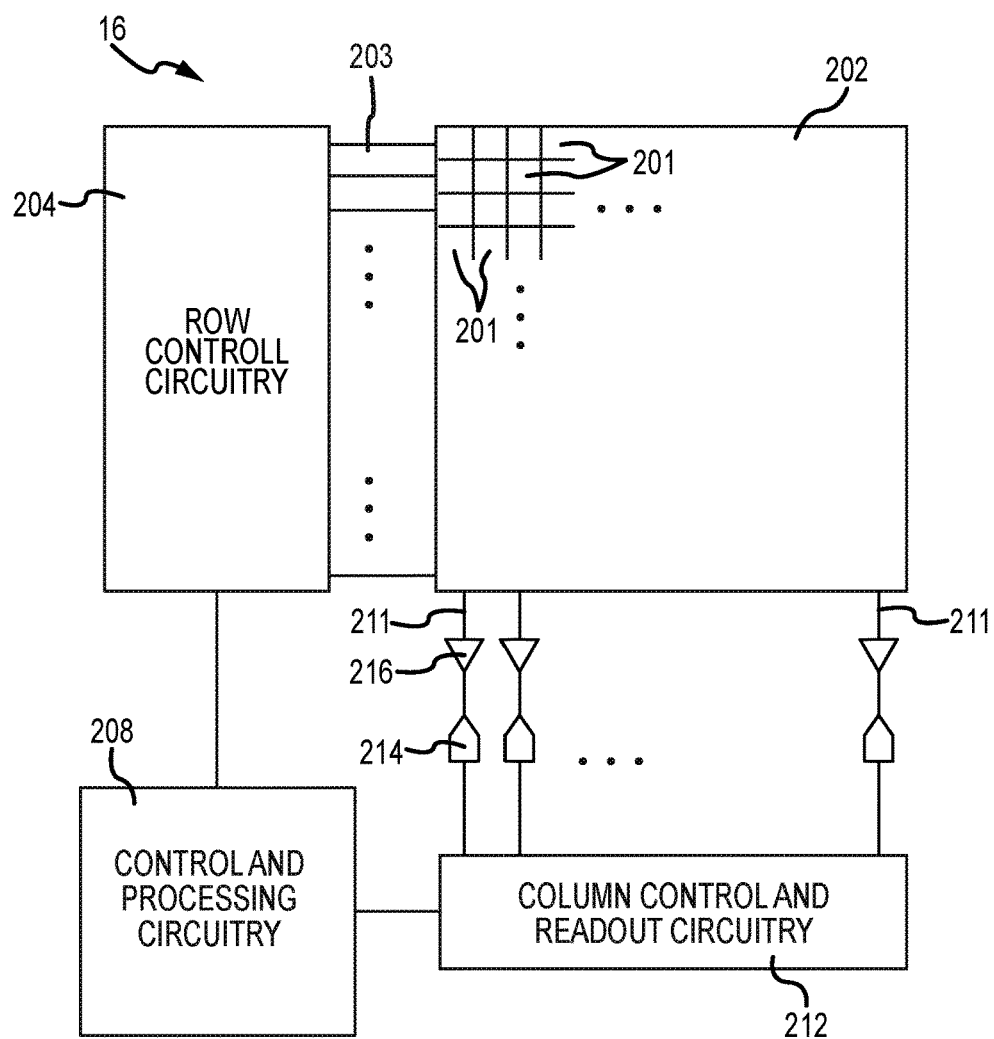
FIG. 2 is a diagram of an illustrative image pixel array in an image sensor in accordance with an embodiment of the present invention.

FIG. 2 is a diagram of an illustrative image pixel array in an image sensor As shown in FIG. 2, the image sensor (e.g., image sensor 16 of FIG. 1) may include pixel array 202 having multiple pixels 201 (sometimes referred to herein as image pixels 201 or image sensor pixels 201) and row control circuitry 204 that is coupled to image pixel array 202. Row control circuitry 204 may provide pixel control signals (e.g., row select signals, pixel reset signals, charge transfer signals, etc.) to pixels 201 over corresponding row control lines 203 to control the capture and read out of images using image sensor pixels in array 202.

Image sensor 16 may include column control and readout circuitry 212 and control and processing circuitry 208 that is coupled to row control circuitry 204 and column circuitry 212. Column control circuitry 212 may be coupled to array 202 via multiple column lines 211. For example, each column of pixels 201 in array 202 may be coupled to a respective column line 211. A corresponding analog-to-digital converter (ADC) 214 and column amplifier 216 may be interposed on each column line 211 for amplifying analog signals captured by array 202 and converting the captured analog signals to corresponding digital pixel data. Column control and readout circuitry 212 may be coupled to external hardware such as processing circuitry. Column control and readout circuitry 212 may perform column readout based on signals received from control and processing circuitry 208.

Column control and readout circuitry 212 may include column ADC circuits 214 and column amplifiers 216.

Amplifier 216 may be configured to receive analog signals (e.g., analog reset or image level signals) from pixel array 202 and to amplify the analog signals. The analog signals may include data from a single column of pixels or from multiple columns of pixels, depending on the application. ADC 214 may receive amplified analog signals from amplifier 216 and may perform analog-to-digital conversion operations on the analog signals to generate digital data. The digital data may be transmitted to column control and readout circuitry 212 for processing and readout.

Figure 3:
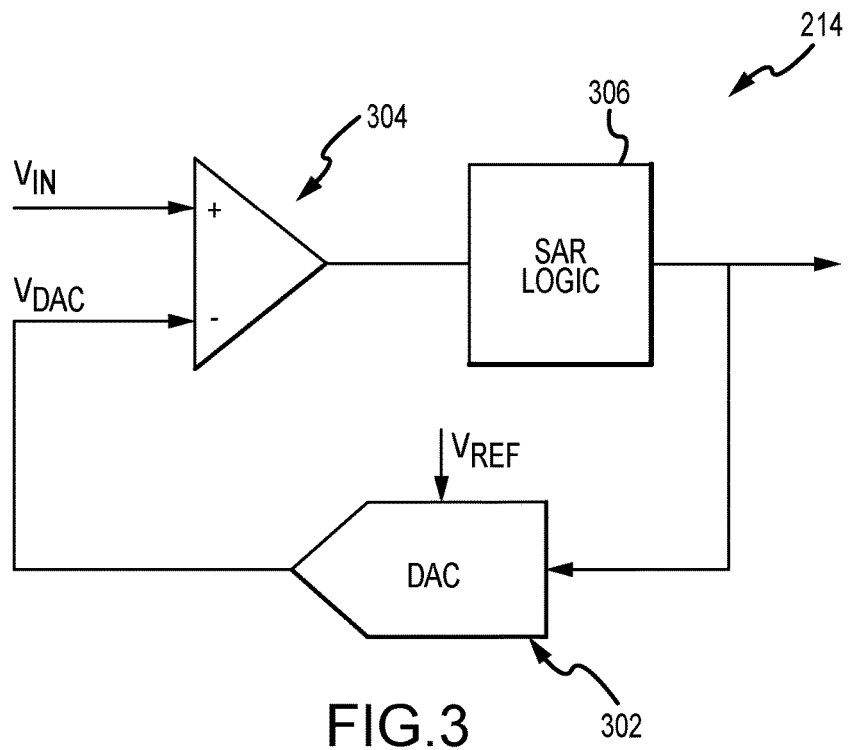
FIG. 3 is a schematic diagram of an illustrative analog-to-digital converter (ADC) that may be included in an image sensor in accordance with an embodiment of the present invention.

FIG. 3 is a schematic diagram of an illustrative analog-to-digital converter (ADC) that may be included in an image sensor (e.g., ADC 214 in FIG. 2). As discussed in connection with FIG. 2, ADC 214 may receive analog signals from pixel array 202. ADC 214 may receive an input signal $V_{IN}$. The input signal $V_{IN}$ may be an analog signal from one or more pixels 201 in pixel array 202 (for example, received over column line 211). ADC 214 may be used to convert input analog signal $V_{IN}$ to digital pixel data.

ADC 214 may be a successive-approximation-register (SAR) ADC. A successive-approximation-register ADC uses a binary search algorithm that is implemented using digital-to-analog converter (DAC) 302, comparator 304, and successive-approximation-register (SAR) logic 306. DAC 302 may output an analog signal $V_{DAC}$ that is compared to pixel signal $V_{IN}$ by comparator 304. The voltage output by DAC 302 ($V_{DAC}$) may be varied, thereby allowing successive comparisons to $V_{IN}$. Each comparison may further narrow the range of possible values of $V_{IN}$, with the number of comparisons determining the resolution of the conversion. DAC 302 may receive a reference voltage as input ($V_{REF}$). The output voltage from DAC 302 may be a known function of $V_{REF}$. For example, $V_{DAC}$ may be equivalent to half of the reference voltage, a quarter of the reference voltage, three quarters of the reference voltage etc. DAC 302 may receive signals from SAR logic 306 that determine the output of DAC 302.

Comparator 304 may receive voltage $V_{IN}$ at a first input and voltage $V_{DAC}$ at a second input. The comparator may compare the magnitude of voltage $V_{IN}$ to the magnitude of voltage $V_{DAC}$. The output of comparator 304 may be a signal that is provided to SAR logic 306. The signal may have a value indicative of which signal has a higher voltage (e.g., the comparator output may be asserted at a logic high level "1" if $V_{IN}$ is greater than $V_{DAC}$ whereas the comparator output may be provided at a logic low level "0" if $V_{DAC}$ is greater than $V_{IN}$).

The example of FIG. 3 in which ADC 214 is described as a successive-approximation-register ADC is merely illustrative. In general, ADC 214 may be any desired type of ADC (e.g., direct-conversion, ramp-compare, integrating, etc.). SAR logic 306 in FIG. 3 may sometimes be referred to as processing circuitry. Processing circuitry 306 may track the results of comparisons by comparator 304 and adjust the output of DAC 302 accordingly. Processing circuitry 306 may ultimately output the result of the analog-to-digital conversion (i.e., a digital representation of $V_{IN}$). DAC 302 may be any desired type of digital-to-analog converter. For example, DAC 302 may be a charge-sharing digital-to-analog converter.

Figure 4:
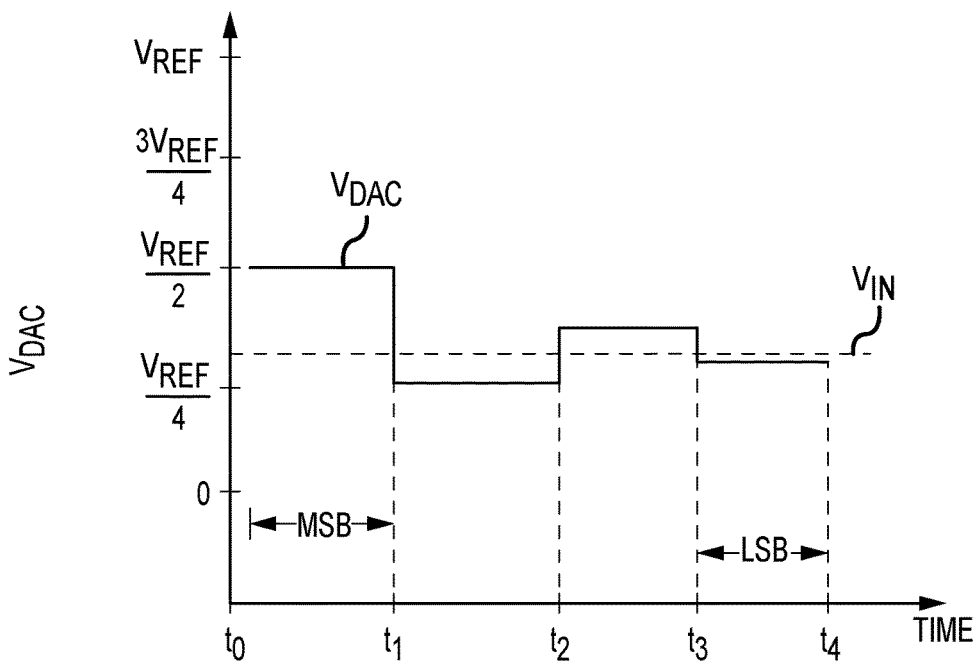
FIG. 4 is a graph showing operation of an illustrative successive-approximation-register analog-to-digital converter in accordance with an embodiment of the present invention.

FIG. 4 is a graph showing operation of an illustrative successive-approximation-register analog-to-digital converter. $V_{DAC}$ is shown changing over time as $V_{DAC}$ converges on the value of $V_{IN}$. At $t_0$, the output of DAC 302 may be set to $V_{REF}/2$ by SAR logic 306. Between $t_0$ and $t_1$, $V_{DAC}$ (which is equal to $V_{REF}/2$) is compared to $V_{IN}$ by comparator 304. In the example of FIG. 4, $V_{IN}$ is less than $V_{REF}/2$. Accordingly, the comparator output may be provided at a logic low level "0" indicating that $V_{DAC}>V_{IN}$. The SAR logic may set the most significant bit (MSB) to 0 as a result of this comparison. The SAR logic then moves on to analyze the next bit. Between $t_1$ and $t_2$, $V_{DAC}$ is set to $V_{REF}/4$ (the halfway point between 0 and $V_{REF}/2$). In the example of FIG. 4, $V_{IN}$ is greater than $V_{REF}/4$. Accordingly, the comparator output may be provided at a logic high level "1" indicating that $V_{IN}>V_{DAC}$. The SAR logic may set the next bit to 1 as a result of this comparison. The SAR logic then moves on to analyze the next bit. Between $t_2$ and $t_3$, $V_{DAC}$ is set to $3V_{REF}/8$ (the halfway point between $V_{REF}/2$ and $V_{REF}/4$). In the example of FIG. 4, $V_{IN}$ is less than $3V_{REF}/8$. Accordingly, the comparator output may be provided at a logic low level "0" indicating that $V_{DAC}>V_{IN}$. The SAR logic may set the next bit to 0 as a result of this comparison. Finally, the least significant bit (LSB) is analyzed between $t_3$ and $t_4$. Between $t_3$ and $t_4$, $V_{DAC}$ is set to $5V_{REF}/16$ (the halfway point between $3V_{REF}/8$ and $V_{REF}/4$). In the example of FIG. 4, $V_{IN}$ is greater than $5V_{REF}/16$. Accordingly, the comparator output may be provided at a logic high level "1" indicating that $V_{IN}>V_{BAC}$. The SAR logic may set the least significant bit to 1 as a result of this comparison.

FIG. 4 shows how successive-approximation may be used to converge upon the value of $V_{IN}$. In the example of FIG. 4, only four bits of resolution are shown. However, it should be understood that any desired amount of resolution may be obtained by increasing the number of comparisons. The more comparisons performed, the smaller the possible range of values for $V_{IN}$ becomes. For example, in FIG. 4 $V_{IN}$ was determined as being greater than $5V_{REF}/16$ and less than $3V_{REF}/8$. Additional comparisons may narrow this range even further.

Additionally, it should be noted that $V_{IN}$ is determined as a function of $V_{REF}$. In other words, a known voltage reference is provided to DAC 302. DAC then produces an output voltage $V_{DAC}$ $V_{DAC}=D \times V_{REF}$ where D is a multiplying factor (i.e., ½, ¼, ⅜, ¾, etc.). The reference voltage $V_{REF}$ is known. The SAR logic is used to determine the value of "D" for which $V_{DAC}=V_{IN}$. Thereafter, SAR logic calculates $V_{IN}=D \times V_{REF}$ to determine the value of $V_{IN}$.

Figure 5:
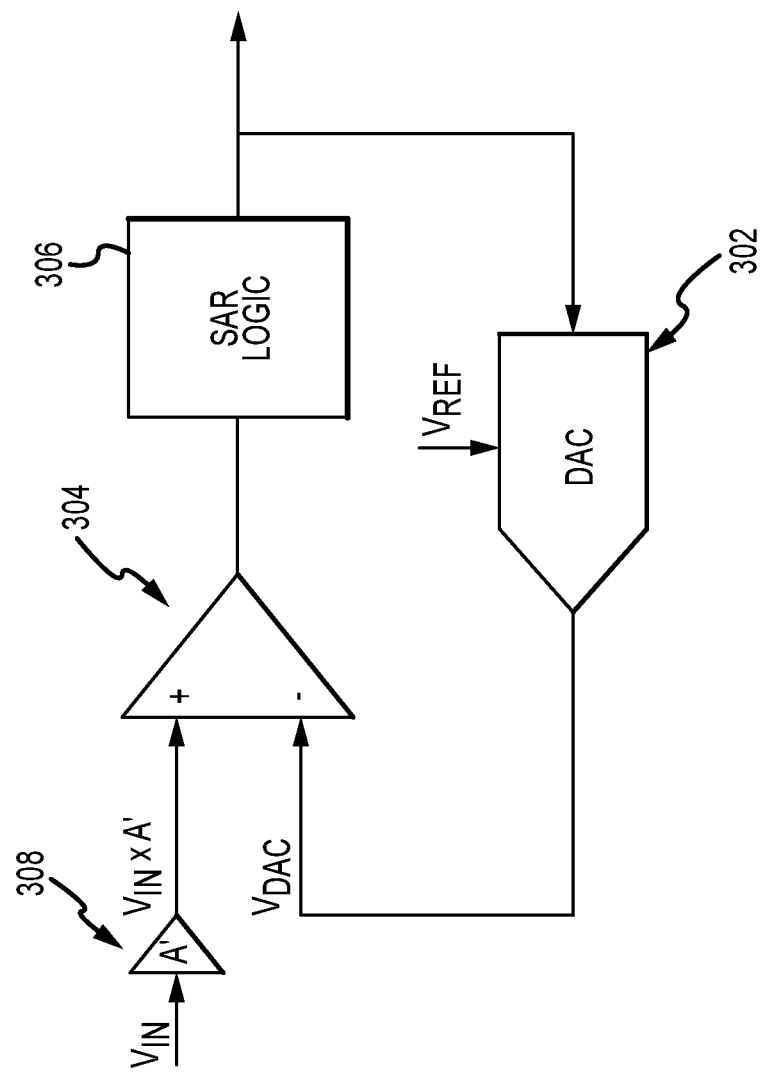
FIG. 5 is a schematic diagram of an illustrative analog-to-digital converter and amplifier that may be included in an image sensor in accordance with an embodiment of the present invention.

In some embodiments, as shown in FIG. 2, an output from column line 211 may be amplified by an amplifier. FIG. 5 is a schematic diagram of an illustrative analog-to-digital converter and amplifier that may be included in an image sensor. Amplifier 308 (which may be amplifier 216 in FIG. 2, for example) may amplify input signal $V_{IN}$ from column line 211 before the value of $V_{IN}$ is determined by comparator 304, digital-to-analog converter (DAC) 302, and successive-approximation-register (SAR) logic 306. Amplifier 308 may be characterized by a gain A'. Therefore, amplifier may receive input signal $V_{IN}$ as an input and output the input signal multiplied by A'. In other words, the output of amplifier 308 is $V_{IN} \times A'$.

Previously in connection with FIGS. 3 and 4, it was discussed how $V_{IN}$ was determined as a function of $V_{REF}$ (i.e., $V_{IN}=D \times V_{REF}$). In the example of FIG. 5, $V_{IN}$ has been amplified so that the first input to comparator 304 is now $V_{IN} \times A'$. Therefore, the representative equation is now: $V_{IN} \times A'=D \times V_{REF}$. Solving for $V_{IN}$ results in the final equation: $V_{IN}=(D \times V_{REF})/A'$. SAR logic 306 determines "D" using the results of the comparisons by comparator 304 (as discussed in connection with FIGS. 3 and 4). Voltage reference $V_{REF}$ is known. Ideally, the gain of amplifier 308 (A') is known. If this is the case, $V_{IN}$ can be accurately determined. However, in reality the gain of amplifier 308 may be difficult to know with a high degree of precision. Accurately determining $V_{IN}$ is dependent upon using an accurate gain value A' (since $V_{IN}$ is a function of A'). Therefore, variance in gain value A' may cause inaccuracies in converting $V_{IN}$ to a digital value. It is desirable to avoid uncertainties in $V_{IN}$ ADC conversion caused by uncertainty regarding the gain of the amplifier.

Figure 6:
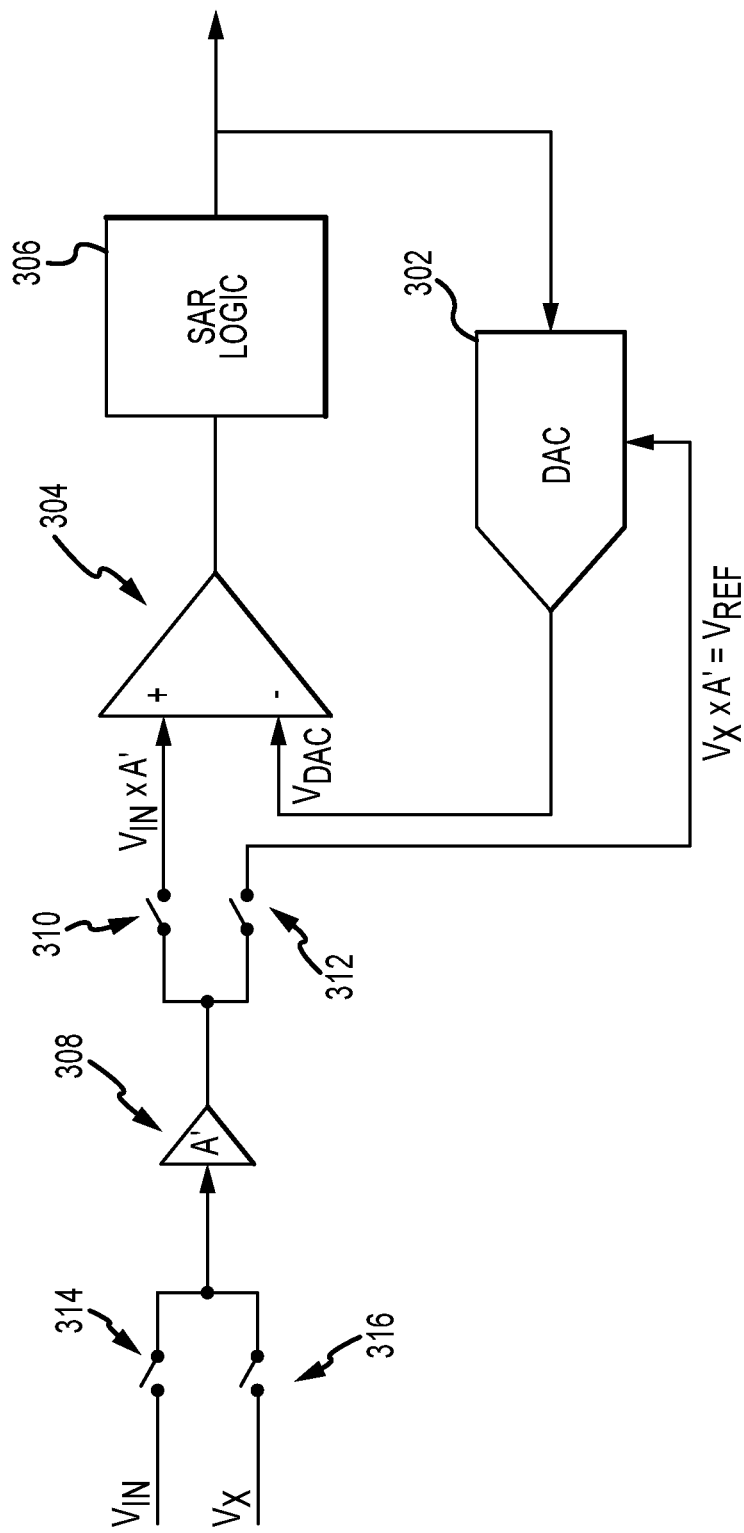
FIG. 6 is a schematic diagram of an illustrative analog-to-digital converter and amplifier that mitigate the effects of amplifier gain uncertainties in accordance with an embodiment of the present invention.

To avoid uncertainties in $V_{IN}$ analog-to-digital conversion caused by uncertainty regarding the gain of the amplifier, an arrangement of the type shown in FIG. 6 may be used. FIG. 6 is a schematic diagram of an illustrative analog-to-digital converter and amplifier that mitigate the effects of amplifier gain uncertainties.

As shown in FIG. 6, an analog-to-digital converter may be formed from comparator 304, SAR logic 306, and DAC 302 (similar to as discussed in connection with FIGS. 3-5). In some embodiments, DAC 302 may be a charge-sharing DAC. Amplifier 308 may sometimes amplify input signal $V_{IN}$ from column line 211. Amplifier 308 may be characterized by a gain A'. Therefore, amplifier 308 may receive an input signal and output the input signal multiplied by A'. The input to amplifier 308 may be selected by switches 314 and 316. When switch 314 is closed, the voltage $V_{IN}$ from column line 211 may be electrically connected to the amplifier input. When switch 316 is closed, a correction voltage $V_X$ from a reference voltage supply line is electrically connected to the amplifier input.

The output from amplifier 308 may be controlled by switches 310 and 312. The output of amplifier 308 may be directed to comparator 304 by closing switch 310. The output of amplifier 308 may be directed to digital-to-analog converter (DAC) 302 by closing switch 312. In particular, switch 312 may couple the output of amplifier 308 to a reference voltage input in DAC 302. In this way, the output of the amplifier 308 may serve as the reference voltage for DAC 302.

When the amplifier receives $V_{IN}$ as an input (i.e., when switch 314 is closed and switch 316 is open), the amplifier output may be directed to comparator 304 (by closing switch 310). This way, the amplified signal from column line 211 ($V_{IN} \times A'$) may be provided to an input terminal of comparator 304 (similar to as described in connection with FIG. 5). When the amplifier receives $V_X$ as an input (i.e., when switch 316 is closed and switch 314 is open), the amplifier output may be directed to the reference voltage input of DAC 302 (by closing switch 312). Therefore, signal $V_X$ is amplified by the gain factor A' and the resulting signal ($V_X \times A'$) serves as the reference voltage for the digital-to-analog converter. In other words, the reference voltage for DAC 302 is amplified by amplifier 308. DAC 302 may sample the voltage at the reference voltage input to store the reference voltage.

Having the reference voltage ($V_{REF}$) for DAC 302 be amplified by amplifier 308 eliminates errors associated with the gain of amplifier 308. As previously discussed, $V_{IN}$ is determined as a function of $V_{REF}$ (i.e., $V_{IN} = D \times V_{REF}$). In the example of FIG. 6, $V_{IN}$ has been amplified so the first input to comparator 304 is $V_{IN} \times A'$. Consequently, the representative equation is: $V_{IN} \times A' = D \times V_{REF}$. Solving for $V_{IN}$ results in the equation: $V_{IN} = (D \times V_{REF})/A'$. However, now the reference voltage $V_{REF}$ is equal to $V_X \times A'$. Substituting for $V_{REF}$ results in the equation: $V_{IN} = (D \times V_X \times A')/A'$. Importantly, the A' term cancels from this equation, and the final equation is: $V_{IN} = D \times V_X$. SAR logic 306 determines "D" using the results of the comparisons by comparator 304 (as discussed in connection with FIGS. 3 and 4). Voltage $V_X$ is known.

Therefore, even if the value of A' is not known, $V_{IN}$ may be accurately determined. The voltage $V_X$ can be supplied in parallel to the analog-to-digital converter circuitry of every column in the pixel. This means that there will be no mismatch between ADCs within the image sensor.

By amplifying the reference voltage for DAC 302 with the same amplifier that amplifies the input pixel voltage from the column line, the input pixel voltage from the column line ($V_{IN}$) may be accurately determined regardless of the gain of the amplifier. This eliminates errors in $V_{IN}$ analog-to-digital conversion without the need for time-consuming amplifier calibration.

In some embodiments, multiple amplifier and analog-to-digital conversion stages may be used in series. In these cases, errors from amplifier gain uncertainty may still be eliminated using the techniques shown in FIG. 6.

Figure 7:
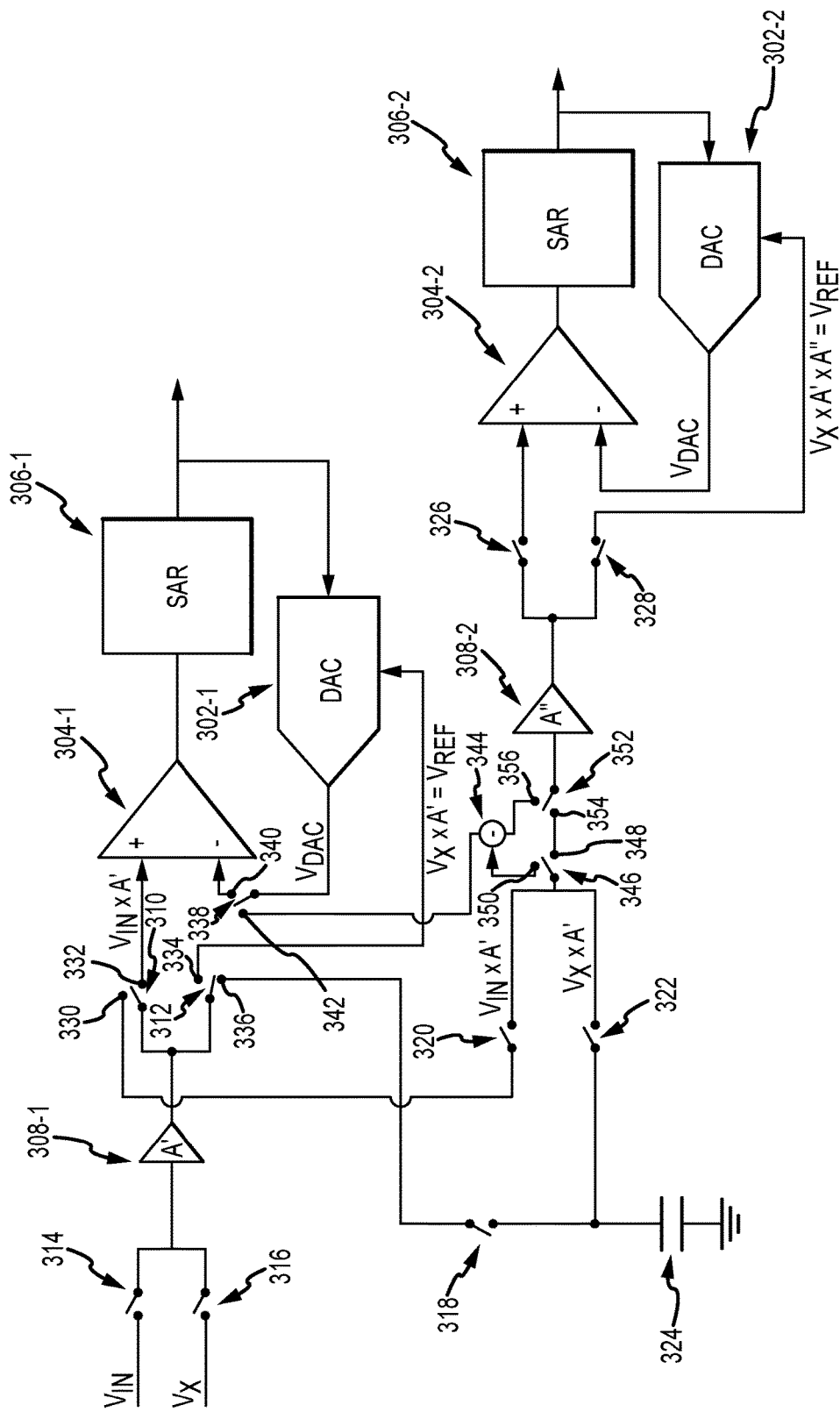
FIG. 7 is a schematic diagram of illustrative analog-to-digital converter and amplifier stages that mitigate the effects of amplifier gain uncertainties in accordance with an embodiment of the present invention.

FIG. 7 is a schematic diagram of illustrative analog-to-digital converter and amplifier stages that mitigate the effects of amplifier gain uncertainties. As shown, the first stage may include digital-to-analog converter (DAC) 302-1, comparator 304-1, SAR logic 306-1, and amplifier 308-1 in an arrangement similar to as shown in FIG. 6. The second stage may include digital-to-analog converter (DAC) 302-2, comparator 304-2, SAR logic 306-2, and amplifier 308-2 in an arrangement similar to as shown in FIG. 6. Similar to FIG. 6, switches 314 and 316 in FIG. 7 may be controlled to provide either $V_{IN}$ or $V_X$ to amplifier 308-1. In FIG. 7, switches 310 and 312 may be present to direct the output of the amplifier. Switch 310 in FIG. 7 may couple the amplifier output to either terminal 330 or terminal 332. When switch 310 is coupled to terminal 330, the amplifier output may be directed to the second amplifier and conversion stage. When switch 310 is coupled to terminal 332, the amplifier output is coupled to comparator 304-1. Switch 312 in FIG. 7 may couple the amplifier output to either terminal 334 or 336. When switch 312 is coupled to terminal 334, the amplifier output may be directed to the reference voltage input of DAC 302-1. When switch 312 is coupled to terminal 336, the amplifier output is directed to the second amplifier and conversion stage.

The output of DAC 302-1 may be coupled to switch 338. Switch 338 may couple the output from DAC 302-1 to either terminal 340 or terminal 342. When switch 338 is coupled to terminal 340, the output from DAC 302-1 may be coupled to comparator 304-1. When switch 338 is coupled to terminal 342, the output from DAC 302-1 may be coupled to subtraction circuit 344.

The first stage may be operated similarly to as discussed in connection with FIG. 6. Switch 314 may be closed and switch 310 may be coupled to terminal 332. This arrangement results in the input voltage ($V_{IN}$) from column line 211 being multiplied by the amplifier gain A'. The resulting signal ($V_{IN} \times A'$) is provided to an input in comparator 304-1. Switch 338 may be coupled to terminal 340 to couple the DAC output to the second input of the comparator. Alternatively, switch 316 may be closed and switch 312 may be coupled to terminal 334. This arrangement results in the correction voltage $V_X$ being multiplied by the amplifier gain A'. The resulting signal ($V_X \times A'$) is provided to DAC 302-1 and serves as the reference voltage ($V_{REF}$) for DAC 302-1.

To ensure accurate analog-to-digital conversion in the second stage, the uncertainty associated with the first amplifier gain A' in the first stage needs to be captured in the second stage. To accomplish this, switch 316 may be closed, switch 312 may be coupled to terminal 336, and switch 318 may be closed. As a result, the amplified correction signal ($V_X \times A'$) is stored in storage capacitor 324. Thus, when switch 322 is closed, switch 328 is closed, switch 346 is coupled to terminal 348, and switch 352 is coupled to terminal 354, the signal from the capacitor ($V_X \times A'$) is multiplied by the amplifier gain A" of amplifier 308-2. The resulting signal ($V_X \times A' \times A''$) is provided to DAC 302-2 and serves as the reference voltage ($V_{REF}$) for DAC 302-2. DAC 302-2 may sample the reference voltage. Then, switch 314 may be closed, switch 310 may be coupled to terminal 330, and switch 320 may be closed. Switch 346 may be coupled to terminal 350 to so that the amplified input signal ($V_{IN} \times A'$) is directed to subtraction circuit 344. The amplified input signal ($V_{IN} \times A'$) and the output from DAC 302-1 ($V_{DAC}$) may be received at subtraction circuit 344. The output of the subtraction circuit 344 is therefore the difference between the amplified input signal ($V_{IN} \times A'$) and the output from DAC 302-1 ($V_{DAC}$). This difference may be provided to the amplifier input (i.e., by coupling switch 352 to terminal 356). The resulting signal is directed to comparator 304-2 by closing switch 326.

This arrangement eliminates uncertainties associated with the gain of second amplifier 308-2 (A"). As previously discussed, $V_{IN}$ (in this case, the output of amplifier 308-2) is determined as a function of $V_{REF}$ (i.e., $V_{IN} = D \times V_{REF}$). In the second stage of FIG. 7, $V_{IN}$ has been amplified by both amplifiers 308-1 and 308-2 so the first input to comparator 304-2 is $V_{IN} \times A' \times A''$. Consequently, the representative equation is: $V_{IN} \times A' \times A'' = D \times V_{REF}$. Solving for $V_{IN}$ results in the equation: $V_{IN} = (D \times V_{REF})/(A' \times A'')$. However, by having the reference voltage be amplified by amplifiers 308-1 and 308-2 as well, the reference voltage $V_{REF}$ is equal to $V_X \times A' \times A''$. Substituting for $V_{REF}$ results in the equation: $V_{IN} = (D \times V_X \times A' \times A'')/(A' \times A'')$. The A' and A" terms cancels from this equation, and the final equation is: $V_{IN} = D \times V_X$. SAR logic 306 determines "D" using the results of the comparisons by comparator 304-2 (as discussed in connection with FIGS. 3 and 4). Voltage $V_X$ is known. Therefore, even if the value of A' and A" are not known, $V_{IN}$ may be accurately determined. The voltage $V_X$ may be equal to $V_{REF}/A$. The voltage for the second amplifier and conversion stage may be referred to as $V_Y$ and may be equal to $V_{REF}/(A*B)$, where A is the expected gain of amplifier 308-1 and B is the expected gain of amplifier 308-2.

In the example of FIG. 7, only two comparator and amplifier stages are shown. However, more than two comparator and amplifier stages may be used. In general, any desired number of comparator and amplifier stages may be used while still accounting for uncertainty in the amplifier gains.

In the embodiments of FIGS. 6 and 7, the input voltage ($V_{IN}$) from column line 211 is described as being coupled to an amplifier through switch 314. It should be understood that additional intervening circuitry may be included between column line 211 and the amplifier. Similarly, any desired additional circuitry may be included in other desired locations within analog-to-digital converter and amplifier stages.

Additionally, the embodiments of FIGS. 6 and 7 show examples of using switches to control the amplifier inputs and outputs. It should be understood that the exact switch arrangements of FIGS. 6 and 7 are merely illustrative, and other arrangements may be used if desired. For example, in FIG. 6 switches 314 and 316 are used to select either $V_{IN}$ or $V_X$ as input for amplifier 308. However, in an alternate embodiment a single switch may be used to select either $V_{IN}$ or $V_X$ as input. Similarly, a single switch may be used to perform the function of switches 310 and 312 in FIG. 6. As another example, in FIG. 7 switches 310 and 312 are used to couple the amplifier output to terminal 330, 332, 334, or 336. However, any desired number (e.g., one, two, three, or four) of switches may be used to couple the amplifier output to terminal 330, 332, 334, or 336.

In various embodiments, an image sensor with rows and columns of imaging pixels may include a column line coupled to a column of imaging pixels, an amplifier comprising an input that receives either a first voltage from the first column line or a second voltage, and an analog-to-digital converter configured to receive an output from the amplifier. The analog-to-digital converter may use the output from the amplifier as a reference voltage when the amplifier receives the second voltage as the input.

The analog-to-digital converter may convert the output from the amplifier to a digital signal when the amplifier receives the first voltage as the input. The analog-to-digital converter may include a comparator a digital-to-analog converter, and processing circuitry. The comparator may have first and second inputs. The first input may be configured to receive the output from the amplifier and the second input may be configured to receive an output voltage from the digital-to-analog converter. The comparator may have an output that is coupled to the processing circuitry. The digital-to-analog converter may receive input from the processing circuitry and the reference voltage from the amplifier. The image sensor may also include at least one switch configured to selectively couple the output from the amplifier to either the first input of the comparator or a reference voltage input of the digital-to-analog converter. The image sensor may also include at least one switch configured to selectively couple the input of the amplifier to either the column line that provides the first voltage or a reference voltage supply line that provides the second voltage.

In various embodiments, an image sensor with rows and columns of imaging pixels may include a column line coupled to a column of imaging pixels, an amplifier comprising an input and an output, a reference voltage supply line, at least a first switch that selectively couples either the column line or the reference voltage supply line to the input of the amplifier, a comparator, a digital-to-analog converter with a reference voltage input, and at least a second switch that selectively couples the output from the amplifier to either the comparator or the reference voltage input of the digital-to-analog converter.

The at least second switch may couple the output from the amplifier to the comparator when the at least first switch couples the column line to the input of the amplifier. The at least second switch may couple the output from the amplifier to the reference voltage input of the digital-to-analog converter when the at least first switch couples the reference voltage supply line to the input of the amplifier. The image sensor may also include processing circuitry that receives an output from the comparator. The processing circuitry may provide an output that is received by the digital-to-analog converter. The comparator may have first and second inputs and the at least second switch may selectively couple the output from the amplifier to either the first input of the comparator or the reference voltage input of the digital-to-analog converter. The digital-to-analog converter may have an output voltage and the second input of the comparator may receive the output voltage from the digital-to-analog converter.

In various embodiments, an image sensor with rows and columns of imaging pixels may include a column line coupled to a column of imaging pixels, a first amplifier that includes an input and an output, a reference voltage supply line, at least a first switch that selectively couples either the column line or the reference voltage supply line to the input of the first amplifier, a first analog-to-digital converter that includes a first comparator and a first digital-to-analog converter, a storage capacitor, a second analog-to-digital converter that includes a second comparator and a second digital-to-analog converter, a second amplifier interposed between the first amplifier and the second analog-to-digital converter, and at least a second switch that selectively couples the output from the first amplifier to either the first comparator, the first digital-to-analog converter, the storage capacitor, or an input of the second amplifier.

The image sensor may also include at least a third switch that selectively couples the storage capacitor to the input of the second amplifier. The image sensor may also include at least a fourth switch that selectively couples an output of the second amplifier to either the second comparator or the second digital-to-analog converter. The at least second switch may be configured to couple the output from the first amplifier to the storage capacitor when the at least first switch is coupled to the reference voltage supply line. The at least second switch may be configured to couple the output from the first amplifier to the input of the second amplifier when the at least first switch is coupled to the column line.

The foregoing is merely illustrative of the principles of this invention and various modifications can be made by those skilled in the art. The foregoing embodiments may be implemented individually or in any combination.

What is claimed is:

1. An analog-to-digital converter comprising:
   a digital-to-analog converter;
   an input configured to receive an output from an amplifier, wherein the analog-to-digital converter uses the output from the amplifier as a reference voltage for the digital-to-analog converter when the amplifier receives an additional reference voltage as an input to the amplifier; and
   at least one switch configured to selectively couple the output from the amplifier to the digital-to-analog converter.

2. The analog-to-digital converter defined in claim 1, wherein the analog-to-digital converter converts the output from the amplifier to a digital signal when the amplifier receives a first voltage that is different from the additional reference voltage as the input to the amplifier.

3. The analog-to-digital converter defined in claim 1, further comprising:
   a comparator; and
   processing circuitry, wherein the comparator has first and second inputs, wherein the first input is configured to receive the output from the amplifier, wherein the second input is configured to receive an output voltage from the digital-to-analog converter, wherein the processing circuitry comprises successive-approximation-register logic, wherein the comparator has an output that is coupled to the successive-approximation-register logic, wherein the digital-to-analog converter receives input from the successive-approximation-register logic, and wherein the digital-to-analog converter receives the output from the amplifier at a reference voltage input.

4. The analog-to-digital converter defined in claim 3, wherein the at least one switch is configured to selectively couple the output from the amplifier to either the first input of the comparator or the reference voltage input of the digital-to-analog converter.

5. The analog-to-digital converter defined in claim 1, wherein the output from the amplifier is provided directly to the digital-to-analog converter when the amplifier receives the additional reference voltage as the input to the amplifier.

6. The analog-to-digital converter defined in claim 1, wherein the analog-to-digital converter uses an analog signal from the amplifier as the reference voltage for the digital-to-analog converter when the amplifier receives the additional reference voltage as the input to the amplifier.

7. The analog-to-digital converter defined in claim 1, further comprising:
   processing circuitry, wherein the digital-to-analog converter has a first input that receives the reference voltage and a second input that receives an output from the processing circuitry.

8. The analog-to-digital converter defined in claim 7, wherein the output from the amplifier is provided to the first input of the digital-to-analog converter when the amplifier receives the additional reference voltage as the input to the amplifier.

9. An image sensor with rows and columns of imaging pixels, the image sensor comprising:
   a column line coupled to a column of imaging pixels;
   an amplifier comprising an input and an output;
   a reference voltage supply line;
   at least a first switch that selectively couples either the column line or the reference voltage supply line to the input of the amplifier;
   a comparator;
   a digital-to-analog converter with a reference voltage input; and
   at least a second switch that selectively couples the output from the amplifier to either the comparator or the reference voltage input of the digital-to-analog converter.

10. The image sensor defined in claim 9, wherein the at least second switch couples the output from the amplifier to the comparator when the at least first switch couples the column line to the input of the amplifier.

11. The image sensor defined in claim 10, wherein the at least second switch couples the output from the amplifier to the reference voltage input of the digital-to-analog converter when the at least first switch couples the reference voltage supply line to the input of the amplifier.

12. The image sensor defined in claim 9, further comprising processing circuitry that receives an output from the comparator.

13. The image sensor defined in claim 12, wherein the processing circuitry provides an output that is received by the digital-to-analog converter.

14. The image sensor defined in claim 9, wherein the comparator has first and second inputs and wherein the at least second switch selectively couples the output from the amplifier to either the first input of the comparator or the reference voltage input of the digital-to-analog converter.

15. The image sensor defined in claim 14, wherein the digital-to-analog converter has an output voltage and wherein the second input of the comparator receives the output voltage from the digital-to-analog converter.

16. An image sensor with rows and columns of imaging pixels, the image sensor comprising:
   a column line coupled to a column of imaging pixels;
   a first amplifier comprising an input and an output;
   a reference voltage supply line;
   at least a first switch that selectively couples either the column line or the reference voltage supply line to the input of the first amplifier;
   a first analog-to-digital converter comprising a first comparator and a first digital-to-analog converter;

a storage capacitor;

a second analog-to-digital converter comprising a second comparator and a second digital-to-analog converter;

a second amplifier interposed between the first amplifier and the second analog-to-digital converter; and at least a second switch that selectively couples the output from the first amplifier to either the first comparator, the first digital-to-analog converter, the storage capacitor, or an input of the second amplifier.

17. The image sensor defined in claim 16, further comprising:

at least a third switch that selectively couples the storage capacitor to the input of the second amplifier.

18. The image sensor defined in claim 17, further comprising:

at least a fourth switch that selectively couples an output of the second amplifier to either the second comparator or the second digital-to-analog converter, wherein the at least second switch is configured to couple the output from the first amplifier to the storage capacitor when the at least first switch is coupled to the reference voltage supply line and wherein the at least second switch is configured to couple the output from the first amplifier to the input of the second amplifier when the at least first switch is coupled to the column line.

* * * * *